(12) United States Patent
Hsia et al.

(10) Patent No.: US 9,766,512 B2
(45) Date of Patent: Sep. 19, 2017

(54) LIQUID CRYSTAL DISPLAY PANEL

(71) Applicant: Au Optronics Corporation, Hsinchu (TW)

(72) Inventors: Tai-Li Hsia, Kaohsiung (TW); Ya-Jung Wang, Kaohsiung (TW); Sung-Yu Su, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/252,229

(22) Filed: Aug. 31, 2016

(65) Prior Publication Data

US 2016/0370667 A1    Dec. 22, 2016

Related U.S. Application Data

(63) Continuation of application No. 14/530,838, filed on Nov. 3, 2014, now abandoned.

(30) Foreign Application Priority Data

Aug. 20, 2014 (TW) .............................. 103128631 A

(51) Int. Cl.
  *H01L 27/12* (2006.01)
  *G02F 1/1343* (2006.01)
  (Continued)

(52) U.S. Cl.
  CPC ...... *G02F 1/134309* (2013.01); *G02F 1/1368* (2013.01); *G02F 1/13439* (2013.01);
  (Continued)

(58) Field of Classification Search
  CPC ........... H01L 2021/775; H01L 27/1214; H01L 27/124; H01L 27/3232; H01L 51/0076;
  (Continued)

(56) References Cited

U.S. PATENT DOCUMENTS 8,471,992 B2   6/2013   Harada et al.
9,287,411 B2   3/2016   Koezuka et al.
(Continued)

FOREIGN PATENT DOCUMENTS

CN    103852942    6/2014
JP    2011164661   8/2011

*Primary Examiner* — Earl Taylor
*Assistant Examiner* — Samuel Park
(74) *Attorney, Agent, or Firm* — Jianq Chyun IP Office

(57) ABSTRACT

A liquid crystal display panel including an array substrate, an opposite substrate disposed opposite to the array substrate and liquid crystal medium between the opposite substrate and the array substrate is provided. The array substrate includes a passivation layer, an insulation layer and a first electrode. The passivation layer has a contact hole. The insulation layer is disposed on the passivation layer and has a concave at a portion overlapped with the contact hole. The first electrode is disposed on the passivation layer and the insulation layer, and has a main portion and stripe portions, wherein a gap is formed between the two adjacent stripe portions. Each stripe portion has a connection portion, at least one turning point and an extending portion. Each connection portion is directly connected to the main portion, and the contact hole is overlapped with at least one connection portion.

17 Claims, 8 Drawing Sheets

(51) Int. Cl.
*G02F 1/1362* (2006.01)
*G02F 1/1333* (2006.01)
*G02F 1/1368* (2006.01)

(52) U.S. Cl.
CPC .. *G02F 1/133345* (2013.01); *G02F 1/136227* (2013.01); *G02F 1/136286* (2013.01); *H01L 27/124* (2013.01); *G02F 1/134363* (2013.01); *G02F 2001/134372* (2013.01); *G02F 2201/121* (2013.01)

(58) Field of Classification Search
CPC ......... H01L 27/14603; H01L 27/14605; H01L 27/14609; H01L 27/14812; H01L 27/3248; H01L 27/326
See application file for complete search history.

(56) References Cited

U.S. PATENT DOCUMENTS

| | | | |
|---|---|---|---|
| 2007/0070278 A1* | 3/2007 | Do | G02F 1/133371 349/129 |
| 2010/0097556 A1* | 4/2010 | Do | G02F 1/133707 349/141 |
| 2011/0109862 A1* | 5/2011 | Harada | G02F 1/134363 349/141 |
| 2013/0271715 A1* | 10/2013 | Kawashima | G02F 1/134336 349/143 |
| 2015/0116622 A1* | 4/2015 | Kim | H01L 27/1296 349/43 |
| 2015/0205172 A1* | 7/2015 | Shin | G02F 1/134363 349/143 |

* cited by examiner

LIQUID CRYSTAL DISPLAY PANEL

CROSS-REFERENCE TO RELATED APPLICATION

This is a continuation application of and claims the priority benefit of a prior application Ser. No. 14/530,838, filed on Nov. 3, 2014, now pending, which claims the priority benefit of Taiwan application serial no. 103128631, filed on Aug. 20, 2014. The entirety of each of the above-mentioned patent applications is hereby incorporated by reference herein and made a part of this specification.

BACKGROUND OF THE INVENTION

1. Field of the Invention

The invention relates to a display panel, and particularly relates to a liquid crystal display panel.

2. Description of Related Art

As the development of liquid crystal display panels advances, high resolution has become one of the basic requirements. Generally speaking, since there are a great number of pixels in a high resolution liquid crystal display panel, it is required to design a metal common line in the panel to improve stability of a common voltage in the panel, so as to reduce flickers or image sticking in an image of the panel. Currently, the design of the metal common line is implemented by bridging an indium tin oxide common line to the metal common line through a contact hole. However, even though the design of adding the metal common line helps maintain the stability of the display image of the panel, the aperture ratio, liquid efficiency, and transmittance rate in the area where the contact hole is disposed in the panel are reduced, making dot mura in the display image occur more frequently. Thus, to realize high resolution display in the liquid display panel under the premise of adding the metal common line, how to prevent reduction of the aperture rate, liquid crystal efficiency, and transmittance rate is certainly an issue to be overcome.

SUMMARY OF THE INVENTION

The invention provides a liquid crystal display panel whose image does not have flickers, image sticking or dot mura. The display panel thus has a preferable display quality.

The liquid crystal display panel of the invention includes an array substrate, an opposite substrate, and a liquid crystal medium. The array substrate includes a passivation layer, a first insulation layer, and a first electrode. The passivation layer has a first contact hole. The first insulation layer is located on the passivation layer, wherein the first insulation layer has a concave at a portion overlapped with the first contact hole. The first electrode is located on the passivation layer and the first insulation layer, and includes a main portion and a plurality of strip portions, wherein a gap is formed between two adjacent strip portions. Each of the strip portions has a connection portion, at least one turning point, and an extending portion, the turning point is located between the connection portion and the extending portion, each of the connection portions is directly connected with the main portion, and the first contact hole is overlapped with at least one connection portion. The opposite substrate is disposed opposite to the array substrate. The liquid crystal medium is disposed between the array substrate and the opposite substrate.

Another liquid crystal display panel of the invention includes an array substrate, an opposite substrate, and a liquid crystal medium. The array substrate includes a passivation layer, a first insulation layer, and a first electrode. The passivation layer has a first contact hole. The first insulation layer is located on the passivation layer. The first electrode is located on the passivation layer and the first insulation layer, and includes a main portion and a plurality of strip portions, wherein a gap is formed between two adjacent strip portions. Each of the strip portions has a turning point, and an area between a connection line of the turning points of the strip portions and the main portion is overlapped with the first contact hole. The opposite substrate is disposed opposite to the array substrate. The liquid crystal medium is disposed between the array substrate and the opposite substrate.

Based on the above, in the liquid crystal display panel of the invention, the first contact hole overlapped with at least one connection portion of the first electrode or overlapped with the area between the connection line of the turning points and the main portion of the first electrode is disposed in the pixel structures. With such configuration, flickers, image sticking or dot mura in an image of the liquid crystal display panel is reduced, and the display panel thus provides the preferable display quality.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
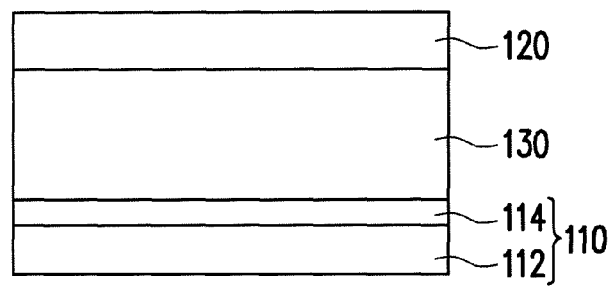
FIG. 1 is a schematic cross-sectional view illustrating a liquid crystal display panel according to an embodiment of the invention.

Reference will now be made in detail to the present preferred embodiments of the invention, examples of which are illustrated in the accompanying drawings. Wherever possible, the same reference numbers are used in the drawings and the description to refer to the same elements.

Figure 2:
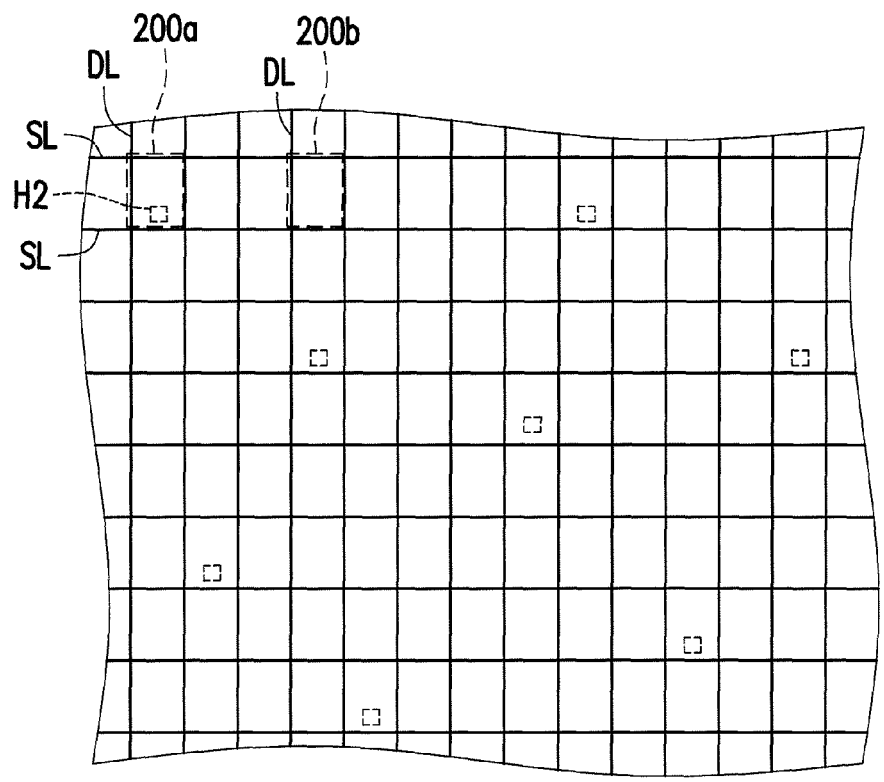
FIG. 2 is a schematic top view of an array substrate in the liquid crystal display panel of FIG. 1.
Figure 3A:
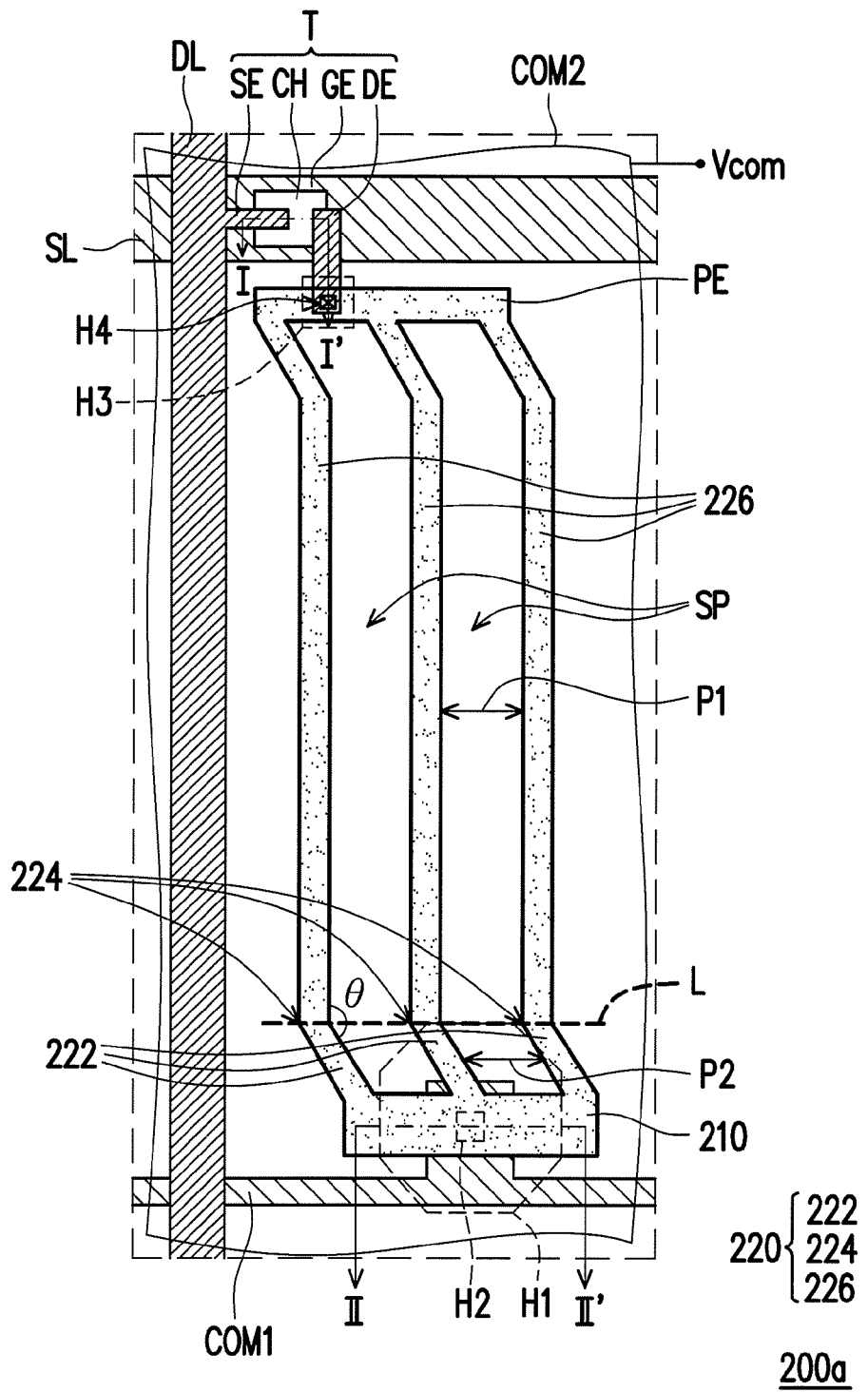
FIG. 3A is a schematic top view of a pixel structure 200a of FIG. 2.
Figure 3B:
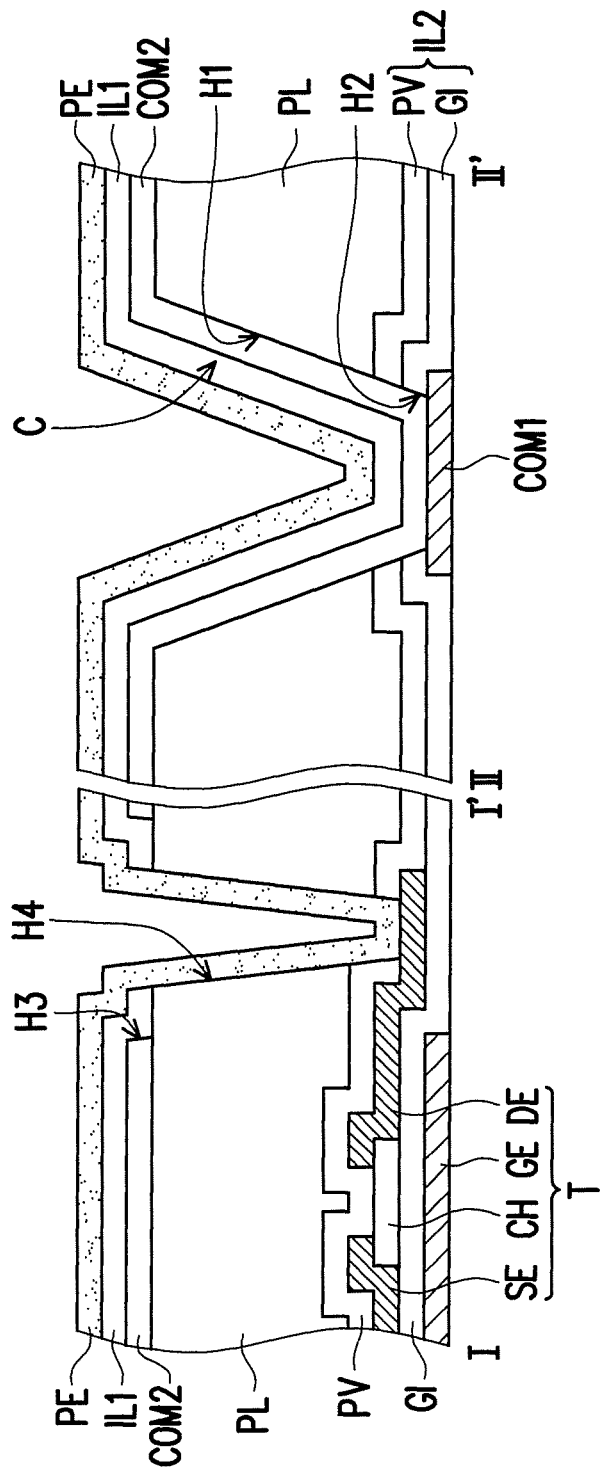
FIG. 3B is a schematic cross-sectional view along cross-sectional lines I-I' and II-II' of FIG. 3A.
Figure 4A:
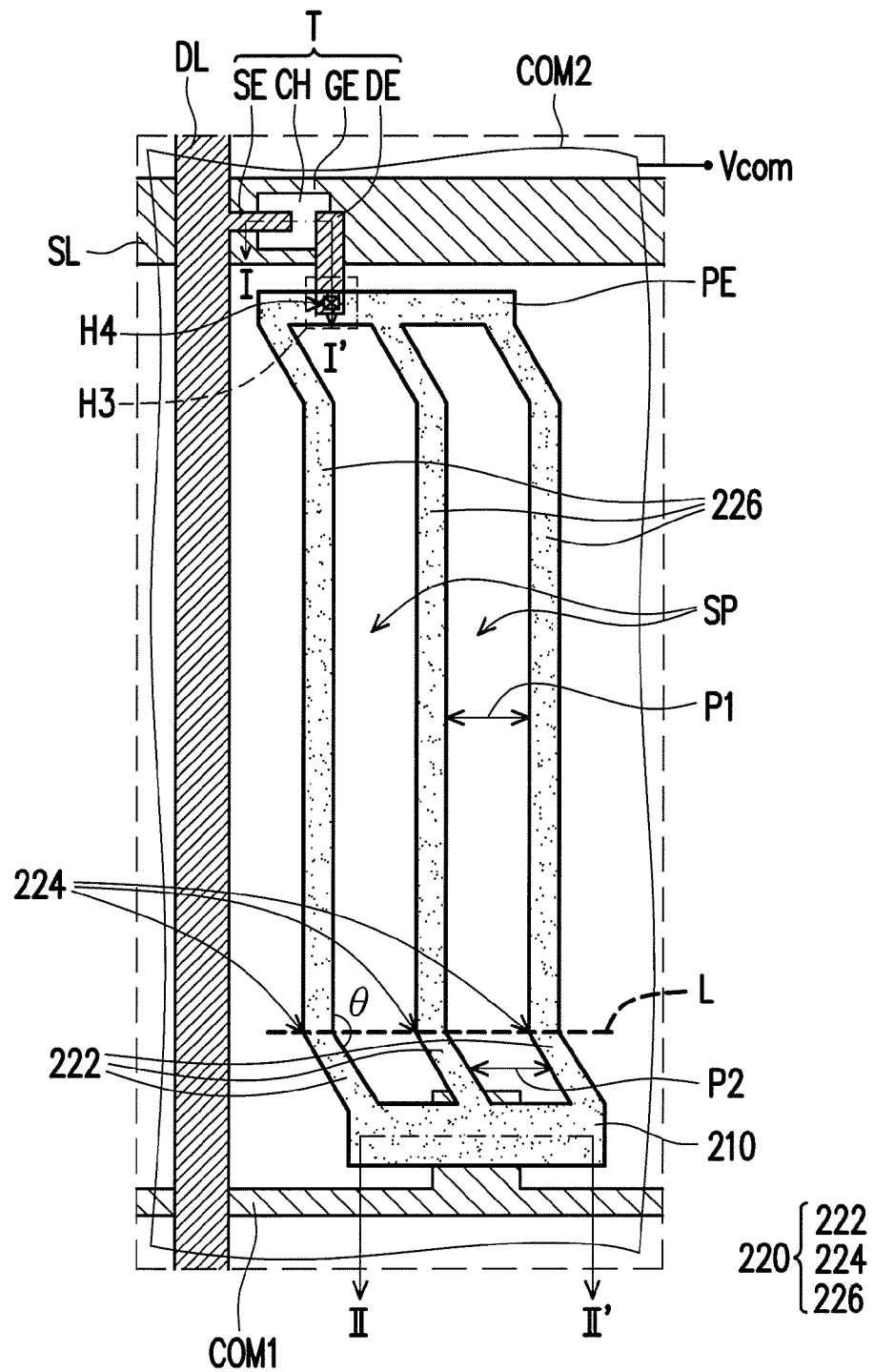
FIG. 4A is a schematic top view of a pixel structure 200b of FIG. 2.
Figure 4B:
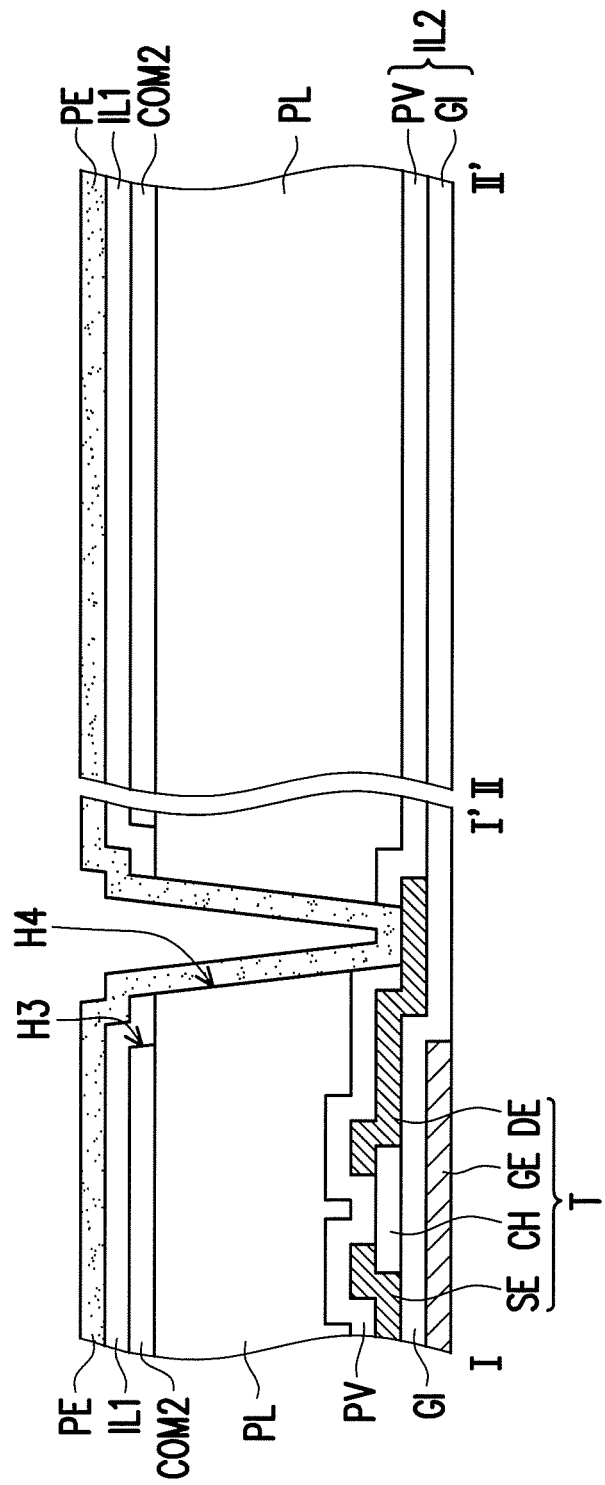
FIG. 4B is a schematic cross-sectional view along cross-sectional lines I-I' and II-II' of FIG. 4A.

FIG. 1 is a schematic cross-sectional view illustrating a liquid crystal display panel according to an embodiment of the invention. FIG. 2 is a schematic top view of an array substrate in the liquid crystal display panel of FIG. 1. FIG. 3A is a schematic top view of a pixel structure 200a of FIG. 2. FIG. 3B is a schematic cross-sectional view along cross-sectional lines I-I' and II-II' of FIG. 3A. FIG. 4A is a schematic top view of a pixel structure 200b of FIG. 2. FIG. 4B is a schematic cross-sectional view along cross-sectional lines I-I' and II-II' of FIG. 4A.

Referring to FIG. 1, a liquid crystal display panel 100 includes an array substrate 110, an opposite substrate 120, and a liquid crystal medium 130. In this embodiment, the liquid crystal display panel 100 is a fringe field switching liquid crystal display panel, for example.

Referring to FIGS. 1 and 2 together, the array substrate 110 includes a substrate 112 and a pixel array 114. The material of the substrate 112 may be glass, quartz, an organic polymer, or metal, etc. The pixel array 114 is disposed on the substrate 112, and the pixel array 114 includes a plurality of pixel structures 200a and a plurality of pixel structures 200b. In addition, the pixel structures 200a and 200b are arranged into a plurality of lines and columns. Details with respect to the design of the pixel structures 200a and 200b will be described in the following.

The opposite substrate 120 is disposed opposite to the array substrate 110. The material of the opposite substrate 120 may be glass, quartz, or an organic polymer, etc. A color filter array layer (not shown) may be further disposed on the opposite substrate 120, and the color filter array layer includes red, green, and blue light filtering patterns. In addition, a light shielding pattern layer (not shown) may be further disposed on the opposite substrate 120. The light shielding pattern layer is disposed between the patterns of the color filter array layer to block elements and wiring in the liquid crystal display panel 100 that are supposed to be hidden from the user and to prevent light leakage as well.

The liquid crystal medium 130 is located between the array substrate 110 and the opposite substrate 120. In this embodiment, the liquid crystal medium 130 is liquid crystal molecules, for example.

In the following, the pixel structures 200a and 200b are described in details with reference to FIGS. 2, 3A, 3B, 4A, and 4B.

Referring to FIGS. 2, 3A, and 3B, the pixel structure 200a includes a scan line SL, a data line DL, an active device T, a first electrode PE, a common line COM1, a second electrode COM2, a passivation layer PL, a first insulation layer IL1, and a second insulation layer IL2.

Extending directions of the scan line SL and the data line DL are different. Preferably, the extending direction of the scan line SL and the extending direction of the data line DL are perpendicular to each other. In addition, the scan line SL and the data line DL are located on different layers, and there is an insulation layer (not shown) disposed between the two layers. The scan line SL and the data line DL are primarily used to transmit a driving signal for driving the pixel structure 200a. In this embodiment, the material of the scan line SL and the data line DL is metal, for example.

The active device T is electrically connected with the scan line SL and the data line DL. Here, the active device T is a thin film transistor, for example, and includes a gate GE, a channel layer CH, a drain DE, and a source SE.

In addition, there is a gate insulation layer GI between the gate GE, and the source SE and the drain DE. Moreover, the channel layer CH is disposed between the gate insulation layer GI, and the source SE and the drain DE. The gate GE and the scan line SL is a continuous conductive pattern, indicating that the gate GE and the scan line SL are electrically connected to each other. Moreover, the source SE and the data line DL is a continuous conductive pattern, indicating that the source SE and the data line DL are electrically connected to each other. In other words, when a control signal is input to the scan line SL, the scan line SL and the gate GE are electrically conductive to each other, and when a control signal is input to the data line DL, the data line DL and the source SE are electrically conductive to each other.

Besides, another insulation layer PV may cover the active device T, and the insulation layer PV may be deemed as a protection layer. In an example, the thickness of the gate insulation layer GI is 0.4 µm, and the thickness of the insulation layer PV is 0.1 µm. Here, the gate insulation layer GI and the insulation layer PV form a second insulation layer IL2.

In this embodiment, the active device T is described as a bottom-gate thin film transistor, for example. However, the invention is not limited thereto. In other embodiments, the active device T may be a top-gate thin film transistor.

The common line COM1 intersects the data line DL, and is electrically insulated from the scan line SL and the data line DL. In this embodiment, the common line COM1, the scan line SL, and the gate GE are formed by a same layer. In other words, the material of the common line COM1 is metal, for example. Viewing from another perspective, the second insulation layer IL2 covers the common line COM1, and the second insulation layer IL2 has a second contact hole H2 to expose a portion of the common line COM1. In other words, the gate insulation layer GI and the insulation layer PV share the second contact hole H2.

The passivation layer PL is located on the second insulation layer IL2 and covers the active device T and the common line COM1. The passivation layer PL has a first contact hole H1. The first contact hole H1 and the second contact hole H2 are overlapped and connected with each other. In other words, the first contact hole H1 also exposes a portion of the common line COM1. In this embodiment, the first contact hole H1 and the second contact hole H2 are in a concentric arrangement, as shown in FIG. 3A. However, the invention is not limited to the illustration of FIG. 3A, as long as the first contact hole H1 and the second contact hole H2 are overlapped and connected with each other.

Besides, the thickness of the passivation layer PL is from 1.3 µm to 3 µm, for example. In an example, the thickness of the passivation layer PL is 2 µm. It should be noted that since the passivation layer PL is significantly thicker than the second insulation layer IL2, when the second insulation layer IL2 and the passivation layer PL are exposed, the time for a chemical etching treatment to the passivation layer PL is longer, and the opening of the first contact hole H1 is thus significantly larger than the opening of the second contact hole H2. In other words, the projection area of the first contact hole H1 is greater than the projection area of the second contact hole H2.

The second electrode COM2 is located on the passivation layer PL. Specifically, the second electrode COM2 is filled into the first contact hole H1 and the second contact hole H2, and thus is electrically connected with the first common line COM1. In addition, the second electrode COM2 has a third contact hole H3 to expose a portion of the passivation layer PL. In this embodiment, the second electrode COM2 is a common electrode, for example. The second electrode COM2 is electrically connected to a common voltage Vcom, and the material of the second electrode COM2 includes a metal oxide, such as indium tin oxide, indium zinc oxide, aluminum tin oxide, aluminum zinc oxide, indium germanium zinc oxide, or other suitable oxides, or a stack layer of at least two of the aforesaid materials.

It should be noted that, in this embodiment, the second electrode COM2 is electrically connected to the common line COM1 through a plurality of the first contact holes H1 and a plurality of the second contact holes H2 (see FIG. 2 for the distribution of the second contact holes H2). In this way, stability of the common voltage among the pixel structures in the liquid crystal display panel 100 is able to be improved, and flickers and image sticking in a display image may be prevented.

The first insulation layer IL1 is located on the passivation layer PL. Specifically, the first insulation layer IL1 is filled into the third contact hole H3 and covers the second electrode COM2. In this embodiment, since the first contact hole H1 has a large opening, when the first insulation layer IL1 is formed on the passivation layer PL, the first insulation layer IL1 is conformally formed in the first contact hole H1 and the second contact hole H2. Therefore, a portion of the first insulation layer IL1 overlapped with the first contact hole H1 and the second contact hole H2 has a concave C forming an uneven surface. It should be noted that the uneven surface caused by the concave C makes the pattern of the first electrode PE desired to be formed subsequently on the first insulation layer IL1 unable to be completely defined, and the liquid crystal efficiency is thus compromised. Further details in this regard will be described subsequently. In an example, the thickness of the first insulation layer IL is from 0.15 μm to 0.20 μm, and preferably 0.16 μm.

The first electrode PE is located on the first insulation layer IL1, and is electrically connected with the active device T. Specifically, the first electrode PE is electrically connected with the drain DE of the active device T through a fourth contact hole H4. In addition, the first insulation layer IL1, the passivation layer PL and the insulation layer PV share the fourth contact hole H4. It should be noted that the fourth contact hole H4 and the third contact hole H3 are overlapped with each other, and the opening of the third contact hole H3 is larger than the opening of the fourth contact hole H4. In this way, the first insulation layer IL1 filled into the third contact hole H3 is capable of preventing the second electrode COM2 from contacting the first electrode PE, so as to prevent a short circuit. In this embodiment, the first electrode PE is a transparent conductive layer, for example, and includes a metal oxide, such as indium tin oxide, indium zinc oxide, aluminum tin oxide, aluminum zinc oxide, indium germanium zinc oxide, or other suitable oxides, or a stack layer of at least two of the aforesaid materials.

The first electrode PE has a main portion 210 and a plurality of strip portions 220. In addition, a gap SP is formed between two adjacent strip portions 220. More specifically, each of the strip portions 220 has a connection portion 222, at least one turning point 224, and an extending portion 226. In addition, the turning point 224 is located between the connection portion 222 and the extending portion 226, and each connection portion 222 directly contacts and connects the main portion 210. Besides, the connection portion 222 and the extending portion 226 of each of the strip portions 220 form an obtuse angle θ ranging from 135 degrees to 160 degrees.

In this embodiment, by configuring each the strip portion 220 with the turning point 224 to provide the obtuse angle θ between the connection portion 222 and the extending portion 226, the viscous liquid crystal molecules in the liquid crystal medium 130 are able to be arranged orderly in an area near the turning point 224, thereby preventing distribution of the liquid crystal medium 130 from being disordered. It should be noted that although disposing the turning points 224 prevents the disordered distribution of the liquid crystal molecules, an electrode structure in an area near the connection portion 222 makes the arrangement of the liquid crystal molecules less regular. Therefore, compared with liquid crystal efficiency in an area corresponding to the extending portions 226, the liquid crystal medium 130 in an area corresponding to the connection portions 222 is unable to be used effectively, making the liquid crystal efficiency less preferable.

In this embodiment, the connection portions 222 are substantially parallel to each other, the extending portions 226 are substantially parallel to each other, and a pitch P2 between two adjacent connection portions 222 may be equal to a pitch P1 between two adjacent extending portions 226. In an example, the pitch P1 and the pitch P2 are both 3 μm.

In this embodiment, the first contact hole H1 is overlapped with a portion of the first electrode PE. In other words, the portion of the first electrode PE is formed on the uneven surface having the concave C. Specifically, as shown in FIG. 3A, the first contact hole H1 is overlapped with at least one connection portion 222. Although FIG. 3A illustrates that the first contact hole H1 is overlapped with two connection portions 222, the invention is not limited thereto. The invention applies as long as the first contact hole H1 is overlapped with one of the connection portions 222.

More specifically, the first contact hole H1 is overlapped with an area between a connection line L of the turning points 224 and the main portion 210. Besides, on a vertical projection plane, the connection line L of the turning points 224 is aligned with the first contact hole H1. Namely, on the vertical projection plane, a shortest distance between the connection line L of the turning points 224 and the first contact hole H1 is 0 μm, indicating that the first contact hole H1 is not overlapped with the extending portions 226 at all, and the extending portions 226 are not formed on the uneven surface having the concave C. In this way, the extending portions 226 formed on a relatively flat surface is able to keep the desired pattern, so as to ensure that an area corresponding to the extending portions 226 has the preferable liquid crystal efficiency. On the contrary, the connection portions 222 formed on the uneven surface having the concave C tend to have the issue of being unable to be completely defined and unable to have the desired pattern, making a direction of the liquid crystal medium 130 in the area corresponding to the connection portions 222 disordered and thus reducing the liquid crystal efficiency.

Furthermore, since the arrangement of the liquid crystal molecules in the area near the connection portions 222 is less ordered, through disposing the first contact hole H1 at the position not overlapped with the extending portions 226 at all but only overlapped with the connection portions 222, the position where the arrangement of liquid crystal molecules are less ordered and its influencing factor are completely restrained in an area below the connection line L. Thus, the liquid crystal medium 130 is used effectively and the area corresponding to the extending portions 226 where the preferable liquid crystal efficiency still maintains the preferable liquid crystal efficiency. Consequently, the pixel structure 200a still has the desired liquid crystal efficiency and a desired transmittance rate.

Also, in this embodiment, while there is no pitch between the connection line L of the turning points 224 and the first contact hole H1 on the vertical projection plane, i.e., the shortest distance therebetween is 0 μm, the invention is not limited thereto. In other embodiments, on the vertical projection plane, there may be a pitch between the connection line L of the turning points 224 and the first contact hole H1, and the shortest distance therebetween is greater than 0 μm and shorter than or equal to 2 μm.

In addition, the configuration of the first electrode PE of the embodiment is not limited to the configuration shown in FIG. 3A. In other words, as long as each of the strip portions 220 has the connection portion 222, at least one turning point 224, and the extending portion 226, the first electrode PE may be an electrode in an arbitrary configuration in the conventional fringe field switching liquid crystal display panel. For example, while it is illustrated in FIG. 3A that the extending portion 226 is in a straight-line shape, the extending portion 226 may also be in a "<<" shape in other embodiments.

Besides, although the number of the strip portions 220 in the first electrode PE shown in FIG. 3A is three, the invention is not limited thereto. In other embodiment, the number of the strip portions 220 may be adjusted based on the practical needs of the display panel.

Moreover, in this embodiment, by electrically connecting the first electrode PE and the active device T and electrically connecting the second electrode COM2 and the common line COM1 to provide the common voltage Vcom, a voltage difference between the first electrode PE and the second electrode COM2 is generated. Thus, a fringe field is formed to drive the liquid crystal medium 130 to incline toward a direction of the electrical field to achieve a displaying effect. Nevertheless, the invention is not limited thereto. In other embodiments, the first electrode PE may be electrically connected with the common voltage Vcom, and the second electrode COM2 may be electrically connected with the active device T, as long as the voltage difference between the first electrode PE and the second electrode COM2 is provided to form the fringe field.

Then, the pixel structure 200b is described in FIGS. 4A, and 4B. As shown in FIGS. 2, 4A to 4B and 3A to 3B, it can be known that the pixel structure 200b is similar to the pixel structure 200a. Thus, same or similar elements are represented by same or similar symbols, and no further details in this respect will be reiterated below.

Specifically, the pixel structure 200b differs from the pixel structure 200a in that in the pixel structure 200b, the second insulation layer IL2 formed by the gate insulation layer GI and the insulation layer PV does not have the contact hole H2, and the passivation layer PL does not have the first contact hole H1. In other words, in the pixel structure 200b, the second electrode COM2 and the common line COM1 are not electrically connected to each other through the first contact hole H1 and the second contact hole H2.

It should be noted that compared with the pixel structure 200b, even though the uneven surface caused by the concave C reduces the liquid crystal efficiency and the transmittance rate of the pixel structure 200a, the liquid crystal display panel 100 still has the preferable display quality for the following reasons. Generally speaking, when a difference in transmittance rate between two pixel structures is greater than 9%, dot mura in an image may occur. However, in this embodiment, the first contact hole H1 is disposed at the position that is not overlapped with the extending portions 226 but only overlapped with the connection portions 222. Therefore, the uneven surface having the concave C only influences the area corresponding to the connection portions 222 having the less preferable liquid crystal efficiency, and the area corresponding to the extending portions 226 having the preferable liquid crystal efficiency is not influenced.

Thus, the pixel structure 200a is able to maintain the desired liquid crystal efficiency and the desired transmittance rate, such that the difference in transmittance rate between the pixel structure 200a and the pixel structure 200b is kept to be lower than 9% (lower than 2%, for example) to prevent dot mura in the image.

In addition, as shown in FIG. 2, the pixel structures 200a including the second contact hole H2 are randomly distributed and are arranged into lines and columns with the pixel structures 200b. In other words, in this embodiment, the second electrode COM2 is electrically connected to the common line COM1 through the randomly disposed second contact hole H2 and the first contact hole H1.

Based on the embodiment, it can be known that in the liquid crystal display panel 100, by disposing the first contact hole H1 and the second contact hole H2 in the pixel structure 200a and making the first contact hole H1 located at the position that is overlapped with at least one connection portion 222 or overlapped with the area between the connection line L of the turning points 224 and the main portion 210, not only the second electrode COM2 is able to be electrically connected to the common line COM 1 to improve the stability of the common voltage of the liquid crystal display panel 100, thereby preventing flickers and image sticking in the display image, the pixel structure 200a is also maintained with the desired liquid crystal efficiency and the transmittance rate, so as to prevent the dot mura in the display image resulted from the difference in transmittance rate greater than 9% between the pixel structures 200a and 200b.

In addition, in FIG. 3A, although the pitch P2 between two adjacent connection portions 222 in the pixel structure 200a is equivalent to the pitch P1 between two adjacent extending portions 226, the invention is not limited thereto. In other embodiments, to allow the connection portion overlapped with the first contact hole to be completely defined and thus has the desired pattern, the pitch between two adjacent connection parts may be adjusted. In the following, details in this respect will be described with reference to FIG. 5.

Figure 5:
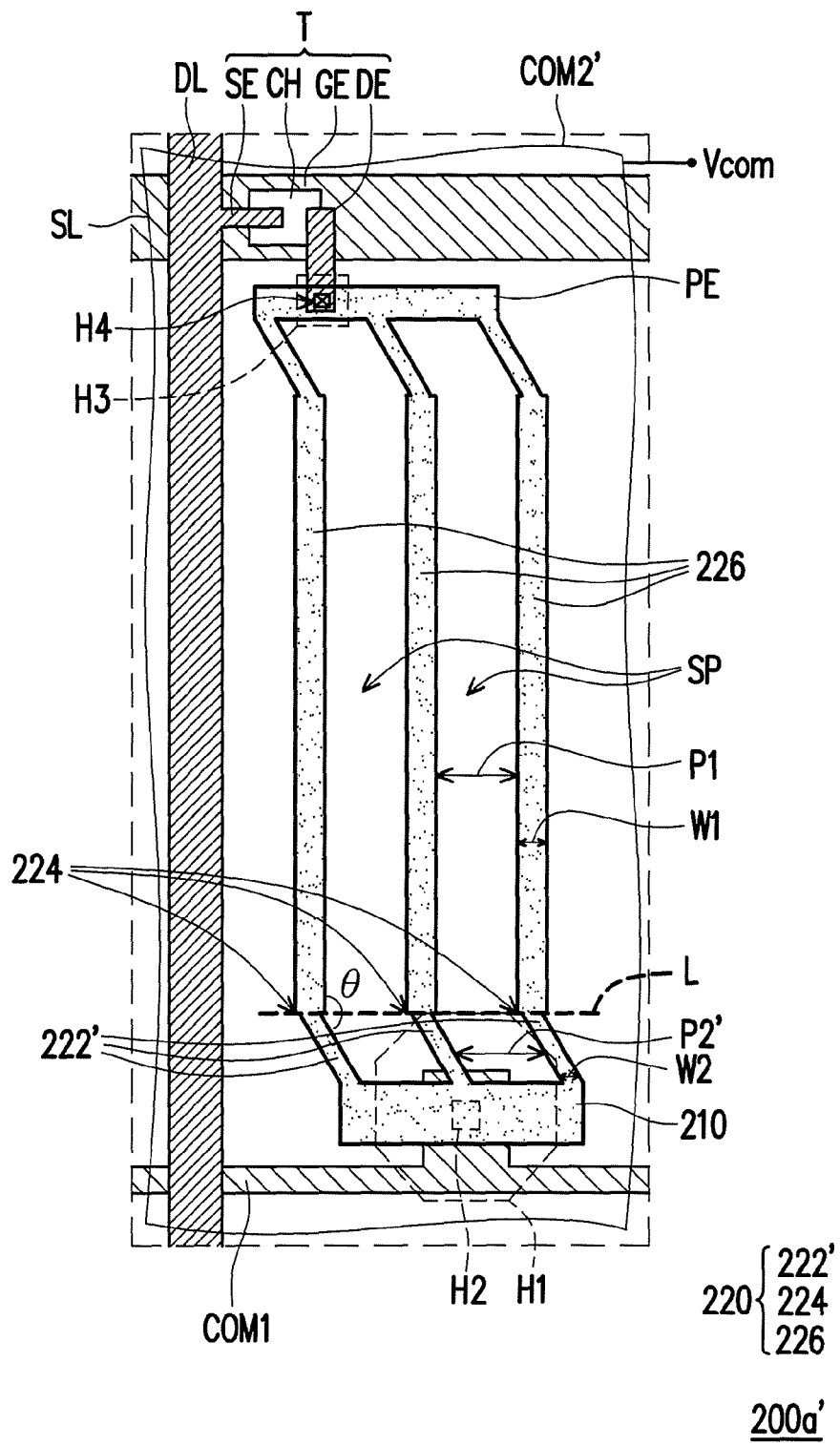
FIG. 5 is a schematic top view illustrating a pixel structure according to another embodiment of the invention.

FIG. 5 is a schematic top view illustrating a pixel structure according to another embodiment of the invention. Referring to FIGS. 3A and 5 together, a pixel structure 200a' in FIG. 5 is similar to the pixel structure 200a of FIG. 3A. Therefore, same or similar elements are referred to by same or similar symbols, and details in this respect will not be reiterated below.

Based on FIGS. 3A and 5, it can be known that the pixel structures 200a' and 200a mainly differ in that in the pixel structure 200a' a pitch P2' between connection portions 222' of two adjacent strip portions 220 is greater than the pitch P1 between the extending portions 226. Specifically, in this embodiment, the pitch P2' is configured to be greater than the pitch P1 by making a line width W2 of the connection portion 222' smaller than a line width W1 of the extending portion 226. In an example, the pitch P2' is 4 μm and the pitch P1 is 3 μm, for example.

It should be noted that in the pixel structure 200a' shown in FIG. 5, the pitch P2' is greater than the pitch P 1. Therefore, even though the first contact hole H1 is still overlapped with at least one connection portion 222' to make the connection portion 222' form on the uneven surface, the connection portion 222' is still able to be completely defined and thus has the desired pattern. In other words, in this embodiment, by adjusting the pitch P2' between two adjacent connection portions 222' to accommodate a limitation on manufacturing capability, the pattern of the connection portions 222' may be defined completely. Thus, the influence of the contact hole H1 on the liquid crystal efficiency and the transmittance rate of the pixel structure 200a' may be reduced, thereby preventing dot mura in the display image.

In addition, with the illustration of FIGS. 1 to 4B, people having ordinary skills in the art shall understand that the pixel array 114 in the liquid crystal display panel 100 may also be realized the pixel structure 200a' shown in FIG. 5 and the pixel structure 200b shown in FIGS. 4A to 4B. By disposing the first contact hole H1 and the second contact hole H2 in the pixel structure 200a', making the first contact hole H1 located at the position that is overlapped with at least one connection portion 222' or overlapped with the area between the connection line L of the turning points 224 and the main portion 210, and setting the pitch P2' to be greater than the pitch P1, not only a second electrode COM2' is electrically connected to the common line COM1 to improve the stability of the common voltage of the liquid crystal display panel 100, thereby avoid flickers and image sticking in the display image, the pixel structure 200a' is also maintained with the desired liquid crystal efficiency and the desired transmittance rate, so as to prevent the dot mura in the display image resulted from the difference in transmittance rate greater than 9% between the pixel structures 200a' and 200b.

Besides, in FIGS. 3A and 3B, although the first contact hole H1 and the second contact hole H2 are overlapped, the invention is not limited thereto. In other embodiments, to allow the second electrode to be electrically connected to the common line, the first contact hole and the second contact hole may not be overlapped with each other. In the following, details in this respect will be described with reference to FIGS. 6A and 6B.

Figure 6A:
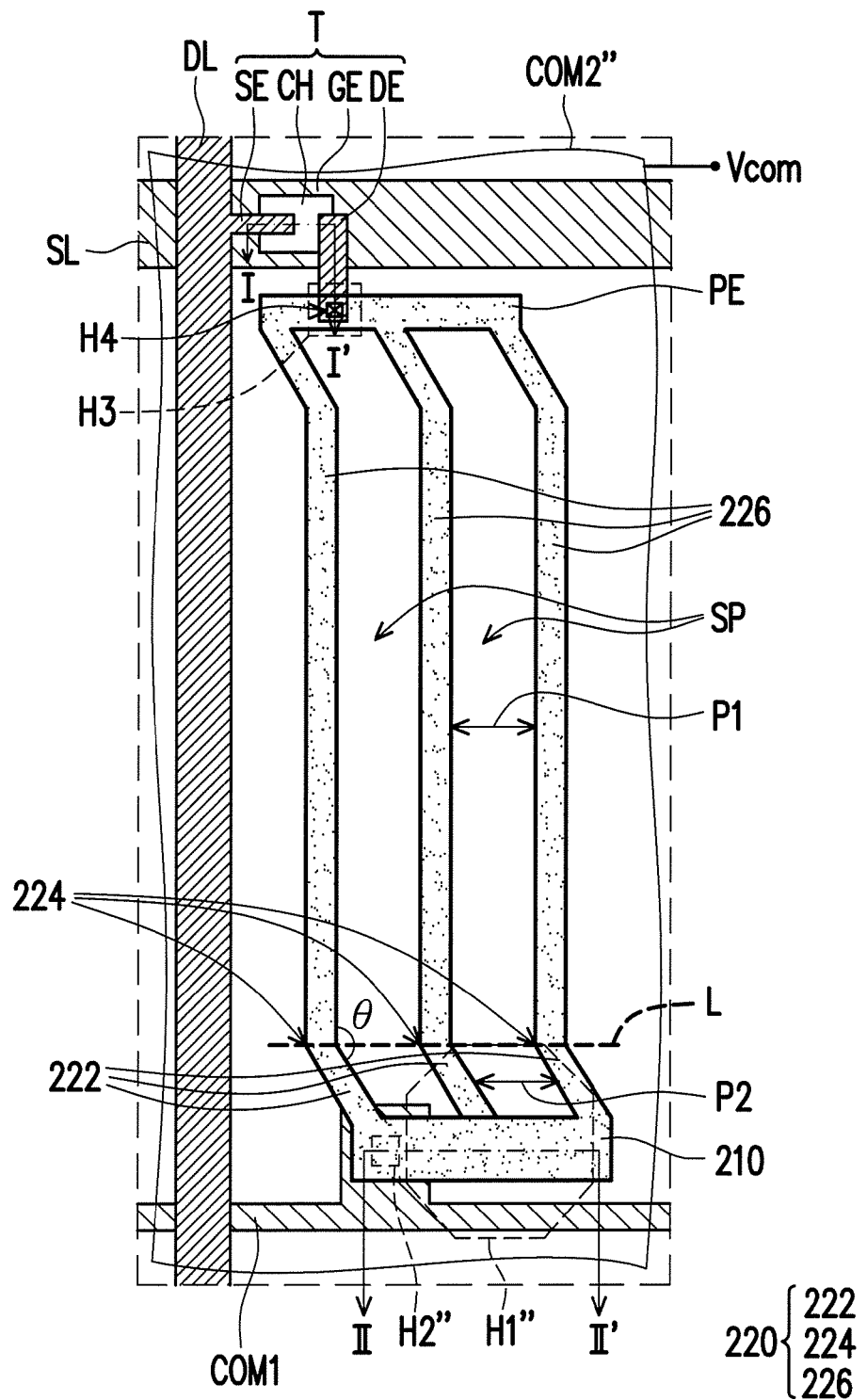
FIG. 6A is a schematic top view illustrating a pixel structure according to another embodiment of the invention.
Figure 6B:
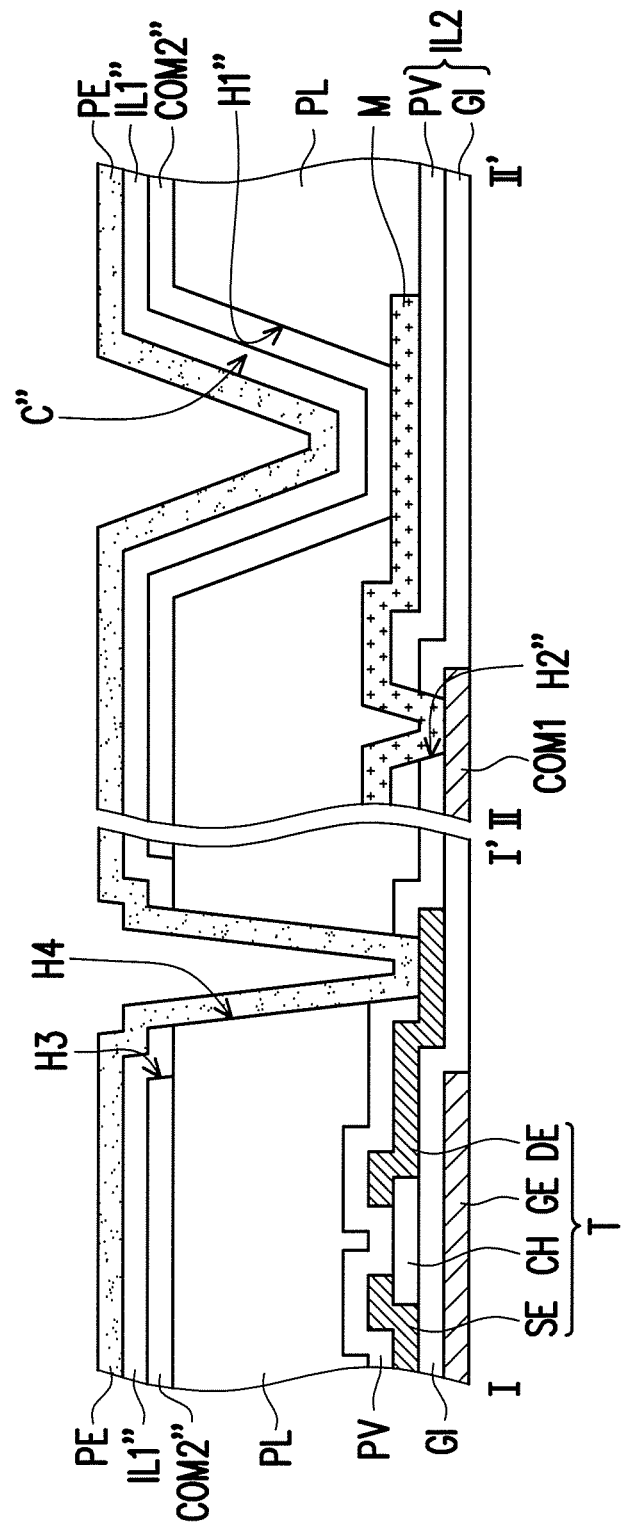
FIG. 6B is a schematic cross-sectional view along cross-sectional lines I-I' and II-II' of FIG. 6A.

FIG. 6A is a schematic top view illustrating a pixel structure according to another embodiment of the invention. FIG. 6B is a schematic cross-sectional view along cross-sectional lines I-I' and II-II' of FIG. 6A. Referring to FIGS. 3A and 6A together, a pixel structure 200a" in FIG. 6A is similar to the pixel structure 200a of FIG. 3A. Therefore, same or similar elements are referred to by same or similar symbols, and details in this respect will not be reiterated below.

Based on FIGS. 3A to 3B and 6A to 6B, it can be known that the pixel structures 200a" and 200a mainly differ in that in the pixel structure 200a", a first contact hole H1" and a second contact hole H2" are not overlapped with each other, while in the pixel structure 200a, the first contact hole H1 and the second contact hole H2 are overlapped with each other.

Specifically, in this embodiment, the pixel structure 200a" further includes a conductive layer M to electrically connect a second electrode COM2" and the common line COM1. In addition, the conductive layer M is located on the passivation layer PV and filled into the second contact hole H2" to be electrically connected with the common line COM1, while the second electrode COM2" is only filled into the first contact hole H1" to be electrically connected with the conductive layer M. In other words, in the pixel structure 200a", the second electrode COM2" is electrically connected to the common line COM1 through the first contact hole H1", the conductive layer M, and the second contact hole H2".

It should be noted that even though a first insulation layer ID" is conformally filled into the first contact hole H1" having a greater opening to form an uneven surface having a concave C" at a portion of the first insulation layer IL1" overlapped with the first contact hole H1", the uneven surface having the concave C" only influence the area corresponding to the connection portions 222 having the less preferable liquid crystal efficiency, and the area corresponding to the extending portions 226 having the preferable liquid crystal efficiency is not influenced, because the first contact hole H1" is disposed at a position that is only overlapped with the connection portions 222 and is not overlapped with the extending portions 226. Thus, the desired liquid crystal efficiency and the desired transmittance rate of the pixel structure 200a" are still maintained.

In addition, with the illustration of FIGS. 1 to 5, people having ordinary skills in the art shall understand that the pixel array 114 in the liquid crystal display panel 100 may also be realized with the pixel structure 200a" shown in FIGS. 6A and 6B and the pixel structure 200b shown in FIGS. 4A to 4B. By disposing the first contact hole H1", the conductive layer M, and the second contact hole H2" in the pixel structure 200a", and making the first contact hole H1" located at the position that is overlapped with at least one connection portion 222 or overlapped with the area between the connection line L of the turning points 224 and the main portion 210, not only the second electrode COM2" is electrically connected to the common line COM1 to improve the stability of the common voltage of the liquid crystal display panel 100, thereby avoid flickers and image sticking in the display image, the pixel structure 200a" is also maintained with the desired liquid crystal efficiency and the desired transmittance rate, so as to prevent the dot mura in the display image resulted from the difference in transmittance rate greater than 9% between the pixel structures 200a" and 200b.

In view of the foregoing, in the liquid crystal display panel of the invention, the first contact hole overlapped with at least one connection portion or overlapped with the area between the connection line of the turning points and the main portion is disposed in some of the pixel structures to electrically connect the second electrode and the common line. With such configuration, the stability of the common voltage is improved to prevent flickers and image sticking in the display image, and the pixel structures are maintained with the desired liquid crystal efficiency and the desired transmittance rate to prevent dot mura in the display image.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. An array substrate, comprising:
a first electrode; and
a second electrode and a common line electrically connected with each other through a first contact hole, wherein the first electrode has:
a main portion; and
a plurality of strip portions, wherein a gap is formed between two adjacent strip portions, and each of at least two of the strip portions has a turning point, wherein an area between a connection line of the turning points and the main portion is overlapped with the first contact hole, and the connection line of the turning points separates at least one of the strip portions into a connection portion and an extending portion such that the connection portion is disposed at an angle compared to the extending portion.

2. The array substrate as claimed in claim 1, wherein the connection portion is overlapped with the first contact hole.

3. The array substrate as claimed in claim 1, further comprising:
a passivation layer having the first contact hole; and
a first insulation layer, located on the passivation layer, wherein the first electrode is located on the passivation layer and the first insulation layer, and at least a portion of the first insulation layer fills into the first contact hole to form a concave corresponding to the first contact hole.

4. The array substrate as claimed in claim 3, wherein a thickness of the passivation layer ranges from 1.3 µm to 3 µm.

5. The array substrate as claimed in claim 3, further comprising a second insulation layer located below the passivation layer, and the second insulation layer has a second contact hole.

6. The array substrate as claimed in claim 5, wherein the first contact hole and the second contact hole are overlapped with each other.

7. The array substrate as claimed in claim 6, wherein the first contact hole and the second contact hole are in a concentric arrangement.

8. The array substrate as claimed in claim 6, wherein the second electrode is electrically connected with the common line through both of the first contact hole and the second contact hole.

9. The array substrate as claimed in claim 1, wherein on a vertical projection plane, a shortest distance from a connection line of the turning points of the strip portions to an edge of the first contact hole is from 0 µm to 2 µm.

10. The array substrate as claimed in claim 1, further comprising:
a scan line and a data line;
an active device, electrically connected with the scan line and the data line; wherein a first insulation layer is located between the first electrode and the second electrode, and the first electrode is electrically connected with the active device.

11. The array substrate as claimed in claim 1, wherein the connection portion and the extending portion of at least one of the strip portions form an obtuse angle ranging from 135 degrees to 160 degrees.

12. The array substrate as claimed in claim 1, wherein the main portion is overlapped with the first contact hole.

13. An array substrate, comprising:
a first electrode; and
a second electrode and a common line electrically connected with each other through a first contact hole, wherein the first electrode has:
a first main portion and a second main portion; and
a plurality of strip portions located between the first main portion and the second main portion, wherein a gap is formed between two adjacent strip portions, and each of at least two of the strip portions has a first turning point, wherein an area between a first connection line of the first turning points and the first main portion is overlapped with the first contact hole, and wherein the first connection line of the first turning points separates at least one of the strip portions into a first connection portion and an extending portion such that the first connection portion is disposed at an angle compared to the extending portion.

14. The array substrate as claimed in claim 13, wherein each of the at least two of the strip portions further has a second turning point, wherein an area between a second connection line of the second turning points and the second main portion is not overlapped with the first contact hole, wherein the first connection line is located between the second connection line and the first main portion.

15. The array substrate as claimed in claim 14, wherein the extending portion is located between the first connection line and the second connection line.

16. The array substrate as claimed in claim 14, further comprises:
a scan line and a data line;
an active device, electrically connected with the scan line and the data line; wherein a first insulation layer is located between the first electrode and the second electrode, and the first electrode is electrically connected with the active device.

17. The array substrate as claimed in claim 16, wherein the extending portion is substantially located between the active device and the common line.

* * * * *